United States Patent
Brooks

[11] Patent Number: 5,808,241
[45] Date of Patent: Sep. 15, 1998

[54] SHIELDED DELAY LINE AND METHOD OF MANUFACTURE

[75] Inventor: Mark Brooks, North Mankato, Minn.

[73] Assignee: Thin Film Technology Corporation, Mankato, Minn.

[21] Appl. No.: 688,105

[22] Filed: Jul. 29, 1996

[51] Int. Cl.⁶ .................................................. H05K 1/00
[52] U.S. Cl. ........................ 174/250; 333/161; 361/777; 29/850
[58] Field of Search .................................. 174/250, 251, 174/260, 261, 268; 361/777, 782, 811; 336/200; 333/161; 29/829, 846, 600, 850, 841, 855

[56] References Cited

U.S. PATENT DOCUMENTS

| | | | |
|---|---|---|---|
| 2,832,935 | 4/1958 | Tank | 333/140 |
| 3,257,629 | 6/1966 | Kornreich | 333/161 |
| 4,614,922 | 9/1986 | Bauman et al. | 333/161 |
| 4,641,113 | 2/1987 | Ozawa | 333/161 |
| 4,641,114 | 2/1987 | Person | 333/161 |
| 5,030,931 | 7/1991 | Brooks et al. | 333/161 |
| 5,146,191 | 9/1992 | Mandai et al. | 333/161 |
| 5,164,692 | 11/1992 | Gertel et al. | 333/238 |
| 5,365,203 | 11/1994 | Nakamura et al. | 333/161 |
| 5,398,046 | 3/1995 | Szegedi et al. | 345/174 |
| 5,499,442 | 3/1996 | Nakamura et al. | 29/600 |

*Primary Examiner*—Kristine L. Kincaid
*Assistant Examiner*—Dhiru R. Patel
*Attorney, Agent, or Firm*—D. L. Tschida

[57] ABSTRACT

A thin film transmission line, delay line constructed on a ceramic substrate. A serpentine, transmission line conductor and a surrounding, coplanar border ground are plated in registry onto the substrate. Discrete ground paths which project from the border are interspersed between the conductor windings to electrically shield adjacent windings. A hard coat epoxy resin covers the signal layer, which may support a sputtered ground plane that is connected to the border ground. An alternative delay line provides overlying ground fingers within the dielectric covering layer which are aligned to the channel spaces between the conductor windings. Both assemblies provide an increased number of conductor lines per chip. Edge coupled terminations are provided at the substrate to accommodate multi-layer assemblies of the delay line and/or circuit terminations.

16 Claims, 6 Drawing Sheets

| STEP | PROCESS | |
|---|---|---|
| 1 | LASER MACHINE | |
| 2 | SPUTTER | |
| 3 | LAMINATION 1 | |
| 4 | EXPOSE 1 | |
| 5 | DEVELOP 1 | |
| 6 | Cu PLATE | |
| 7 | STRIP 1 | |
| 8 | LAMINATION 2 | |
| 9 | EXPOSE 2 | |
| 10 | DEVELOP 2 | |
| 11 | Ni PLATE | |
| 12 | STRIKE GOLD PLATE | |
| 13 | GOLD PLATE | |
| 14 | STRIP 2 | |
| 15 | ETCH 1 | |
| 16 | MICRO ETCH | |
| 17 | CLEAN | |
| 18 | SOLDER RESIST APPLICATION | |
| 19 | SOFT CURE | OPTION: |
| 20 | EXPOSE 3 | SPUTTER |
| 21 | DEVELOP 3 | LAMINATE 3 |
| 22 | HARDCURE | EXPOSE 4 |
| 23 | FINAL CLEAN | DEVELOP 4 |
| 24 | BREAK | PLATE |
| 25 | DC R-CHECK | |
| 26 | ISOLATION | |
| 27 | TIME DELAY | |
| 28 | TAPE & REEL | |

FIG. 5

SHIELDED DELAY LINE AND METHOD OF MANUFACTURE

BACKGROUND OF THE INVENTION

The present invention relates to delay lines and, in particular, to thin film, transmission line delay lines, which are frequently used to adjust timing inconsistencies of complex circuits.

Transmission line assemblies having predetermined, equally distributed signal delay characteristics are known which are constructed on a variety of substrate materials using a variety of processing techniques. Such devices are typically constructed with serpentine conductor paths. The time delay characteristic of any device is principally determined by the physical length of the transmission line. Therefore, the more lines that can be deposited, the greater the length of the possible delay line and time delay and the greater the flexibility for a designer. The lines may be spread over a single layer or a number of stacked and interconnected layers.

Conductor spacings must be adequate to prevent electrical coupling which can result in reflections and signal degradation. Negative inductive coupling, in particular, can occur if the paths are spaced too closely together. Other device characteristics of concern are the numbers and relative positioning of adjacent ground planes and the type and thickness of associated dielectric insulators separating the transmission line and ground layers, which also affect the distributed inductance and capacitance of the resulting device.

Where such devices are used in high frequency applications, a ceramic substrate material, such as aluminum oxide, is typically preferred. Practical substrate limitations at differing thickness, however, limit the size device that can be constructed, unless multi-layering techniques are employed. Conversely, as additional layers are added, fabrication costs rise and yields decrease. Preferably, therefore, it is desired to increase the number of conductor lines that can be deposited in a single layer assembly.

Various transmission line, delay line devices of which Applicant is aware can be found at U.S. Pat. Nos. 5,365,203; 5,164,692; 5,146,191; 5,030,931; 4,641,114; 4,641,113; 3,257,629 and 2,832,935. While some of the foregoing devices incorporate features of construction similar to the subject assembly, none provides a construction that includes the advantages of the present invention.

In an effort to develop a device with an optimal density of conductor lines for the available fabrication space at a ceramic substrate, the invention provides a method and delay line circuits which interlace a ground path between each of the windings of a serpentine conductor. The circuits are overlaid with an epoxy dielectric and a sputtered ground plane. In an alternative construction, the conductor spacing at the windings is further reduced by vertically displacing the intervening ground lines.

SUMMARY OP THE INVENTION

It is accordingly a primary object of the present invention to provide a transmission line delay line constructed on a suitable substrate with optimal conductor length.

It is a further object of the invention to provide a patterned serpentine transmission line including a number of conductive windings in a path wherein the windings are separated by a ground conductor.

It is a further object of the invention to overly the signal windings and interspersed ground paths with an epoxy dielectric and a ground layer.

It is a further object of the invention to provide an assembly which can be laminated with a number of other comparable transmission line delay line layers and/or patterned ground layers.

It is a further object of the invention to provide a patterned transmission line which is coplanar with and bordered by a ground conductor and from which border, electrically grounded fingers extend between the windings of the signal windings to prevent inductive coupling between the windings.

It is a still further object of the invention to provide a patterned transmission line having a number or serpentine windings and overlying which an insulator is coated and ground fingers are deposited intermediate each signal winding to extend between the signal windings and prevent inductive coupling between the windings.

Various of the foregoing objects, advantages and distinctions of the invention can be found in one presently preferred circuit construction which provides an assembly that includes a sputtered, conductive serpentine transmission line that is bordered by a coplanar ground conductor at a ceramic substrate. Fingers of the ground conductor are interspersed between the signal windings. A hard epoxy resin dielectric is applied over the signal windings and ground conductor and a general ground layer is plated over the dielectric and coupled to the border ground conductor. Edge terminations are provided at the circuit which accommodate a surface mount assembly.

In an alternative construction, the patterned signal windings and bordering ground conductor are applied to the substrate and coated over with a benzocydobutene (BCB) polymer. The polymer is partially exposed and developed to form trenches between the signal winding which are filled with ground fingers. The ground fingers are connected to the border ground conductor.

Still other objects, advantages and distinctions of the invention will become more apparent from the following description with respect to the appended drawings. The description should not be literally construed in limitation of the invention. The scope of the invention should rather be interpreted in view of the further appended claims. To the extent alternative constructions, improvements or modifications have been considered, they are described as appropriate.

BRIEF DESCRIPTION OF THE DRAWINGS

FIG. 5 is a flow chart of the assembly process.

DESCRIPTION OF THE PREFERRED EMBODIMENT

Figure 1:
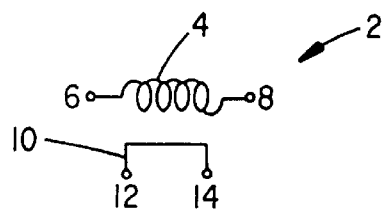
FIG. 1 is a circuit diagram to an exemplary delay line constructed with the invention.

Referring to FIG. 1 a circuit diagram is shown to a representative surface mount delay line 2 that was constructed in accordance with the invention. Typically a number of such devices 2 are simultaneously formed onto a ceramic oxide wafer which forms the substrate of each circuit. When completed and diced to size, the populated substrate forms a number of the discrete delay line devices 2.

Each delay line 2 provides an electrically conductive metalized conductor 4 which is formed in the shape of a serpentine path. The conductor 4 extends between an input terminal 6 and an output terminal 8, which terminals are aligned to the peripheral edges of the ceramic substrate. The conductor 4 presents a uniform 50 ohm impedance over its length, although can be formed to exhibit any desired impedance.

Depending upon the packaging of the device 2, the configuration and location of the conductor 4 and terminals 6 and 8 can be appropriately varied. The shape of the conductor 4 may also be varied to provide any variety of convoluted, wavy or serpentine patterns. A number of devices 2 may also be laminated together and electrically connected to provide increased delays.

A ground conductor 10 is formed to circumscribe the conductor 4 in the plane of the conductor 4 and to overly the conductor 4 in an adjoining plane. A dielectric material separates the overlying ground plane from the conductor 4 in the region of the conductor 4, but otherwise the ground conductors are electrically common. The ground conductor 10 terminates at a pair of edge mounted terminals 12 and 14. The terminals 6, 8, 12 and 14 are formed as refilled solder vias which are severed during the dicing of the wafer. A description to the construction and advantages of such vias is found at U.S. Pat. 5,506,754.

Figure 2:
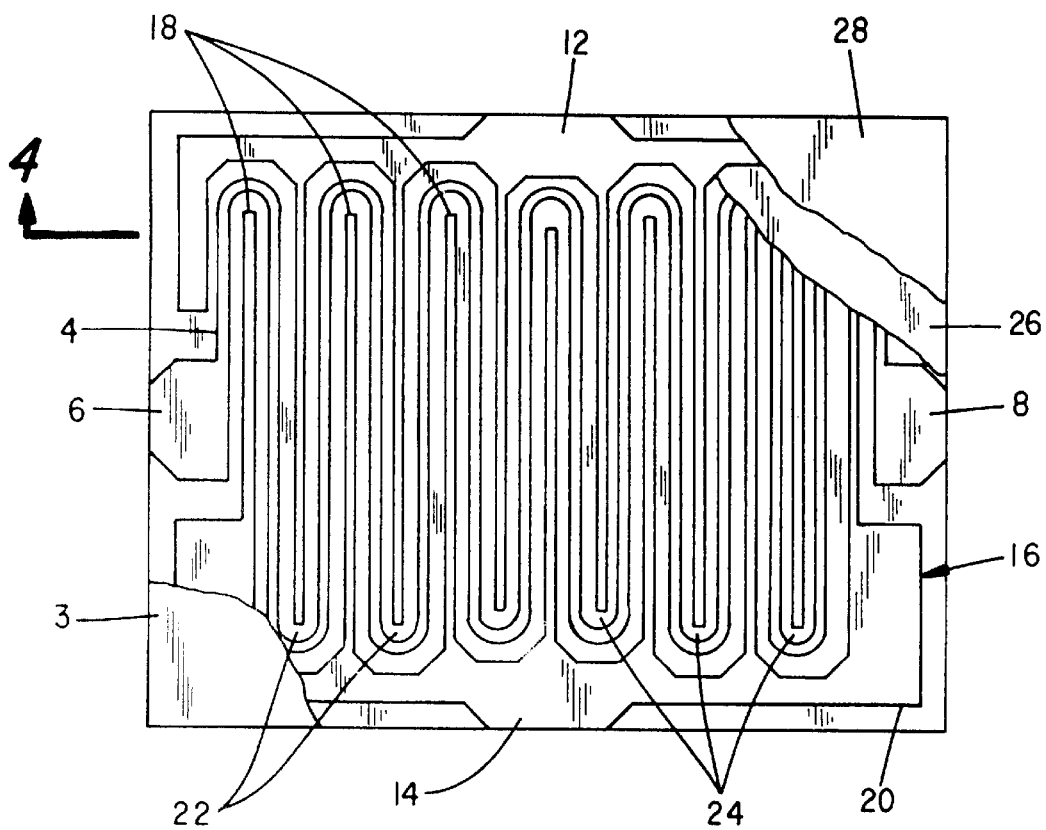
FIG. 2 is a top plan view of the signal conductor and bordering ground layer metalization.
Figure 3:
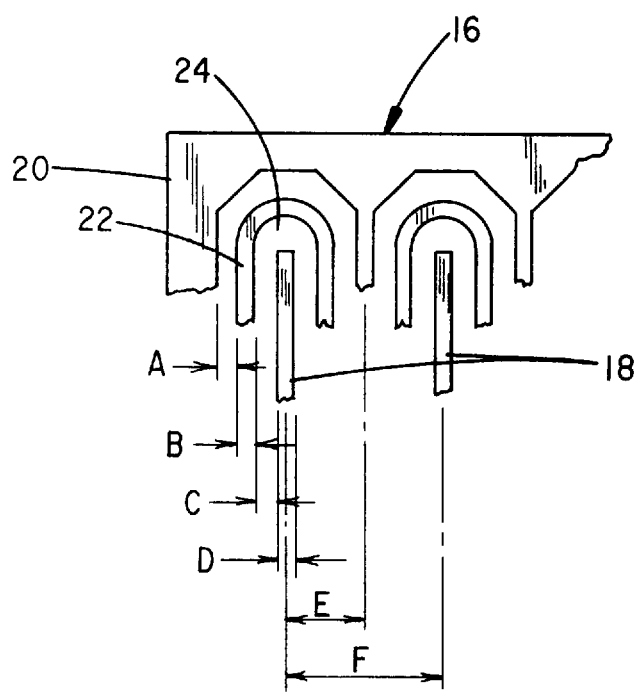
FIG. 3 is a detailed section view to the spacing between adjacent ground fingers and conductor paths.
Figure 4:
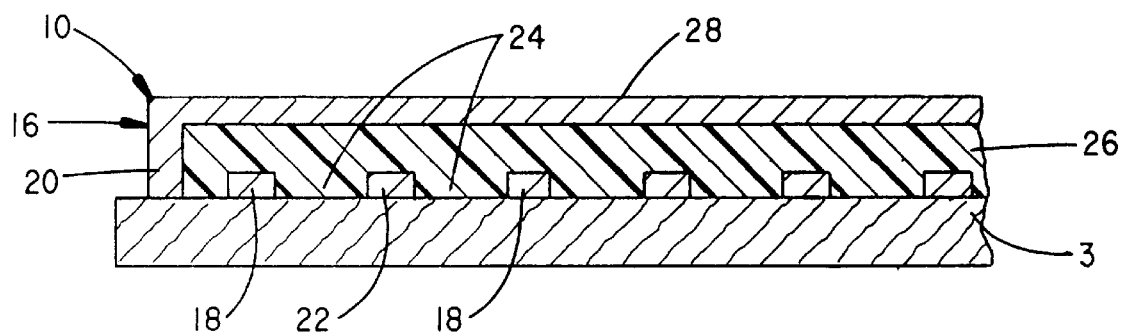
FIG. 4 is a cross section view through the delay line showing the overlying epoxy dielectric insulator and ground layer.

FIGS. 2 through 4 show detailed views to a presently preferred construction of the transmission line delay line 2. The delay line 2 finds application in the assembly of high frequency digital switching assemblies. Delays in the range of 10 to 600 pico seconds are presently obtainable with the device 2.

With attention to FIG. 2, a view is shown to a sputtered metalization layer of the device 2, which is formed over a ceramic substrate 3. The ceramic substrate 3 exhibits a nominal thickness on the order of 0.25 mm and a dielectric constant of 9.6. Formed onto the substrate 3 is the conductor 4, and a ground layer 16, which comprises a portion of the ground 10.

The ground layer 16 includes a number of projecting fingers 18 which extend from a border 20 that circumscribes the conductor 4, except at the terminations 6 and 8. The border 20 does not contact the terminals 6 and 8 nor the conductor 4. The fingers 18 extend into channel spaces 24 between the serpentine windings 22 of the conductor 4. The fingers 18 are centered within the channel spaces 24.

The fingers 18 electrically shield each of the windings 22 from possible cross coupling, particularly, negative inductive coupling. The presence of the fingers 18 in the channel spaces 24 particularly permits a spacing reduction of 130 to 330 microns from a typical spacing of 240 to 450 microns. An approximate 200% increase in the length of the conductor 4 is thereby obtained at the available surface area of the substrate 3 versus that presently obtainable.

With additional attention to FIG. 3, the various dimensions represented at callouts "A" to "F" are presently defined to form a conductor 4 and fingers 18 having line widths "B" and "D" in the range of 30 to 50 microns. Line widths of 50 microns have been used at A and B to produce circuits which provide the desirable electrical performance characteristic shown at FIG. 6. Corresponding gaps "A" and "C" of 30 to 50 microns are provided between the border 20 and the conductor 4 and between the fingers 18 and the conductor 4 within the channel spaces 24; and on center spacings "E" and "F" between the fingers 18 in the range of 160 to 320 microns. Depending upon processing capabilities and the dielectric properties of the substrate 3 and a dielectric layer 26 which covers the conductor 4, the line widths and spacings may be scaled in relation to one another. Although a uniform width and spacing is presently used, the line widths and spacings may also be different from one another.

A hard coat, epoxy resin dielectric 26 is deposited to a thickness in the range of 15 to 25 microns over the conductor 4, fingers 18 and channels 24. The dielectric 26 exhibits a dielectric constant in the range of 2 to 4. A plated, thin film general ground layer 28, in turn, covers the dielectric 26 and is electrically bonded to the border ground 20 and terminals 12 and 14. It is to be appreciated the ground layer 28 can be included or not, as desired.

With attention to the enlarged cross section view at FIG. 4, the conductor 4 is deposited to a thickness of approximately 20 microns. The dielectric 26 is applied to fill the channel spaces 22 between the windings 24 and fingers 18 and to cover the layers 4 and 16 by an additional 15 to 25 microns. The ground layer 28 is deposited over the dielectric 26 to a thickness of 15 to 25 microns and into contact with the border 20.

The sequence of process steps used to construct the device 2 and obtain the foregoing physical shapes and thicknesses are shown at FIG. 5. Initially the ceramic substrate 3 is subjected to a laser machining step wherein vias or through holes are formed at the locations of each of the terminals 4, 6, 12 and 14 or any other vias used to connect to adjoining laminations, such as another device 2 which is serially connected to the conductor 4 to obtain a longer delay. A layer of copper is next generally sputtered or plated onto the substrate 3 in conventional fashion to a thickness in the range of 15 to 25 microns. Through a series of conventional photolithographic processing steps the conductor and ground paths 4 and 16 are formed.

A thermally set, hard coated epoxy resin is applied over the paths 4 and 16 to provide the dielectric layer 26. The ground layer 28 is then plated over the exposed border 20 and terminations 12 and 14, prior to depositing suitable layers of nickel and gold and filling the via terminations with solder. The wafer is scribed and the individual dies are broken apart from the wafer. The electrical impedance and time delay of each device 2 is determined. Lastly, a suitable passivation material is applied and each die is packaged and spooled at a reel dispenser.

Figure 6:
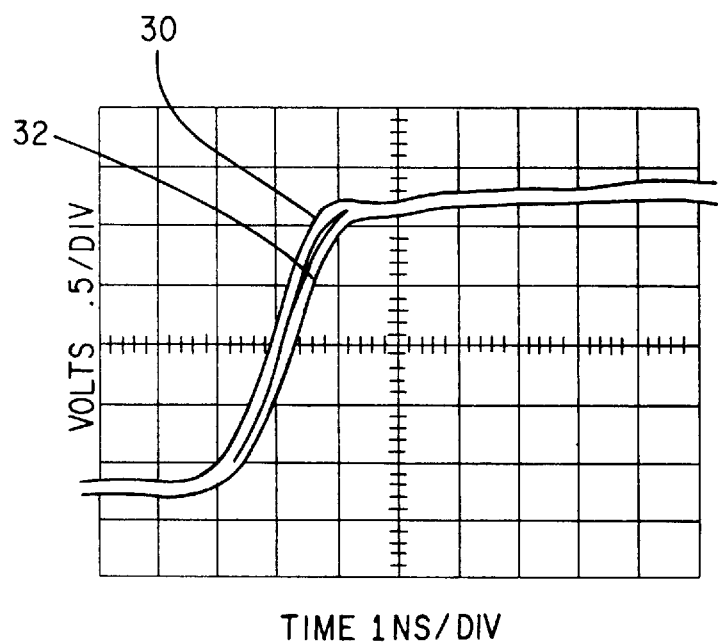
FIG. 6 is a representative positive transition of a square wave signal propagated over the delay line.

FIG. 6 also depicts an oscilloscope tracing of a rising edge of a square wave signal 30 that has been transmitted over the conductor 4. The reflection signal 32 is also shown and which essentially mimics the transmitted signal without any undesired noise at either the rising or falling edge transitions. Essentially linear performance has been measured through 2 GHz. In contrast and for a comparable delay line of conventional construction, insertion losses can affect the signal at less than 1 GHz.

Figure 7:
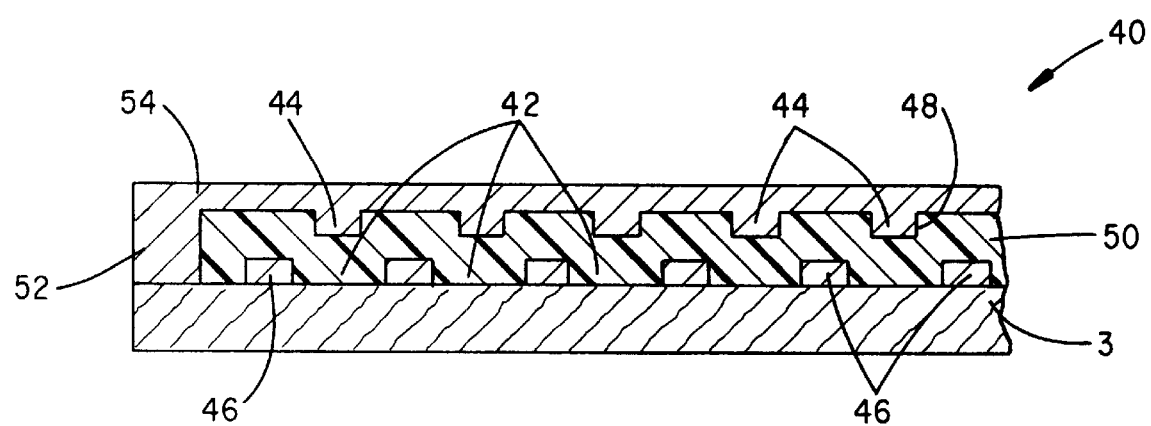
FIG. 7 is section View to an alternative transmission line delay line wherein the ground fingers are formed into a partially exposed overlying polymer dielectric.

FIG. 7 depicts a further improved construction of a delay line device 40 similar to the delay line 2 of FIG. 1. The topography of the device 40 is different in that the channel spacings 42 are more compressed and the ground fingers 44 are positioned above channel spaces 42 between conductor windings 46 and within grooves 48 formed in a hard coat, photo sensitive BCB polymer dielectric 50. The grooves 48 are formed upon partially exposing the dielectric 50. The additional processing steps are shown as an option to FIG. 5.

Otherwise, the conductor windings 46 and a border ground conductor 52 are formed in a comparable fashion to the device 2. An overlying ground layer 54 and the ground fingers 44 are also formed during the optional processing steps shown at FIG. 5. The placement of the ground fingers 44 as depicted permits a further reduction in the surface area required at the substrate 3. An approximate doubling of the space is believed attainable with a corresponding doubling of the windings 46 at the delay line conductor over the device 2.

While the invention has been described with respect to a number of presently preferred circuit components and assembly constructions, it is to be appreciated still other constructions may be suggested to those skilled in the art. The scope of the invention should therefore be construed broadly within the spirit and scope of the following claims.

What is claimed is:

1. Delay line apparatus comprising:
   a) a first conductor layer formed on an electrically insulative substrate to include a serpentine conductor having a plurality of serpentine windings separated from one another and terminating at an input and an output terminal, and a first ground conductor circumscribing said serpentine conductor and having a plurality of conductive finger paths which coaxially project between adjacent ones of said serpentine windings and wherein said serpentine conductor exhibits a constant impedance over its length;
   b) a dielectric layer deposited to overlie said serpentine conductor; and
   c) termination means for coupling to said serpentine conductor and said first ground conductor.

2. Apparatus as set forth in claim 1 wherein each of said serpentine windings are spaced apart a uniform distance from one another and wherein said conductive finger paths are mounted between each pair of said adjacent serpentine windings.

3. Apparatus as set forth in claim 1 including a second ground conductor mounted over said dielectric layer and electrically connected to said first ground conductor.

4. Apparatus as set forth in claim 3 wherein said second ground conductor is deposited over said dielectric layer which is a hardset epoxy resin and coupled to the first ground conductor.

5. Apparatus as set forth in claim 3 wherein said serpentine conductor and first ground conductor are sputtered onto a ceramic substrate.

6. Apparatus as set forth in claim 5 wherein said second ground conductor is deposited over said conductive finger paths and dielectric layer and coupled to the first ground conductor.

7. Apparatus as set forth in claim 1 wherein said conductive finger paths are deposited in grooves in said dielectric layer.

8. Apparatus as set forth in claim 1 wherein said termination means comprises a plurality of vertically sectioned, metalized vias at a peripheral edge of said substrate.

9. Delay line apparatus comprising:
   a) a first conductor layer formed on an electrically insulative substrate to include a serpentine conductor having a plurality of serpentine windings separated from one another and terminating at an input and an output terminal, and a first ground conductor circumscribing said serpentine conductor and wherein said serpentine conductor exhibits a constant impedance over its length;
   b) a dielectric layer deposited to overlie said serpentine conductor;
   c) a plurality of conductive finger paths deposited within grooves in said dielectric layer to overlie and coaxially project between adjacent ones of said serpentine windings and wherein said conductive finger paths are electrically coupled to said first ground conductor; and
   d) termination means for coupling to said serpentine conductor and said first ground conductor.

10. Apparatus as set forth in claim 9 including a ground layer mounted over said dielectric layer and electrically connected to said first ground conductor and said plurality of conductive finger paths.

11. A method for constructing a delay line comprising:
    a) forming a serpentine conductor on an electrically insulative substrate to include a plurality of serpentine windings displaced from one another and terminating at an input and an output terminal and wherein said serpentine conductor exhibits a constant impedance over its length;
    b) forming a first ground conductor to circumscribe said serpentine conductor and having a plurality of conductive finger paths which coaxially project between adjacent ones of said serpentine windings,
    c) depositing a dielectric layer over said serpentine conductor; and
    d) forming a plurality of terminations which couple to said serpentine conductor and said first ground conductor.

12. A method as set forth in claim 11 including depositing a second ground conductor over said dielectric layer and connecting said second ground conductor to said first ground conductor.

13. A method as set forth in claim 11 wherein said serpentine conductor is plated onto a ceramic substrate and said first ground conductor is sputtered onto said dielectric layer.

14. A method as set forth in claim 11 wherein said dielectric layer comprises an epoxy resin.

15. A method as set forth in claim 11 wherein said plurality of projecting finger paths are formed into grooves in said dielectric layer to overlie and coaxially project between the serpentine windings.

16. A method as set forth in claim 15 wherein said dielectric layer comprises a benzocydobutene (BCB) polymer.

* * * * *